United States Patent
Ferri et al.

(10) Patent No.: US 7,449,629 B2
(45) Date of Patent: Nov. 11, 2008

(54) SOLAR PANEL INCLUDING A LOW MOISTURE VAPOR TRANSMISSION RATE ADHESIVE COMPOSITION

(75) Inventors: Louis Anthony Ferri, Solon, OH (US); Steven Michael Milano, Aurora, OH (US)

(73) Assignee: TruSeal Technologies, Inc., Beachwood, OH (US)

( * ) Notice: Subject to any disclaimer, the term of this patent is extended or adjusted under 35 U.S.C. 154(b) by 703 days.

(21) Appl. No.: 10/224,983

(22) Filed: Aug. 21, 2002

(65) Prior Publication Data

US 2004/0216778 A1 Nov. 4, 2004

(51) Int. Cl.
*H01L 31/00* (2006.01)
(52) U.S. Cl. ..................... 136/251; 136/259
(58) Field of Classification Search .......... 136/243–265
See application file for complete search history.

(56) References Cited

U.S. PATENT DOCUMENTS

| | | | |
|---|---|---|---|
| 3,932,341 A * | 1/1976 | Kutch et al. | 523/438 |
| 4,064,521 A | 12/1977 | Carlson | |
| 4,137,098 A | 1/1979 | Field | |
| 4,373,308 A | 2/1983 | Whittaker | |
| 4,587,376 A | 5/1986 | Kosaka et al. | |
| 4,633,032 A * | 12/1986 | Oido et al. | 136/251 |
| 4,724,010 A | 2/1988 | Okaniwa et al. | |
| 4,758,624 A | 7/1988 | Sekiguchi et al. | 525/101 |
| 5,128,181 A | 7/1992 | Kunert | |
| 5,221,363 A | 6/1993 | Gillard | |
| 5,228,925 A | 7/1993 | Nath et al. | |
| 5,241,014 A | 8/1993 | Kehr et al. | 525/376 |
| 5,273,593 A | 12/1993 | Marquardt et al. | |
| 5,355,089 A | 10/1994 | Treger | 324/435 |
| 5,460,660 A | 10/1995 | Albright et al. | |
| 5,478,402 A | 12/1995 | Hanoka | |
| 5,507,880 A * | 4/1996 | Ishikawa et al. | 136/251 |
| 5,524,401 A | 6/1996 | Ishikawa et al. | |

(Continued)

FOREIGN PATENT DOCUMENTS

DE 38 01 989 A1 7/1989

(Continued)

OTHER PUBLICATIONS

Kyocera Solar, Inc., Solar Information Center; "What is a solar cell?"; Internet web site article at http://www.kyocerasolar.com/info/solarcell.html.

(Continued)

*Primary Examiner*—Edna Wong
*Assistant Examiner*—Jeffrey T. Barton
(74) *Attorney, Agent, or Firm*—Renner, Otto, Boisselle & Sklar, LLP

(57) ABSTRACT

A solar panel including a photovoltaic material layer; a backing panel; and an adhesive layer disposed between and adhering together the photovoltaic material layer and the backing panel, in which the adhesive layer comprises an adhesive composition, the adhesive composition comprising a low MVTR polymer or copolymer and a silane-modified polymer or copolymer. In another embodiment, the solar panel includes module wire openings which are filled by an adhesive composition comprising a low MVTR polymer or copolymer and a silane-modified polymer or copolymer. A method of making the solar panel is provided.

2 Claims, 5 Drawing Sheets

U.S. PATENT DOCUMENTS

| | | | |
|---|---|---|---|
| 5,718,772 A * | 2/1998 | Mori et al. | 136/251 |
| 5,733,382 A | 3/1998 | Hanoka | |
| 5,849,832 A | 12/1998 | Virnelson et al. | 524/512 |
| 5,994,474 A * | 11/1999 | Wey et al. | 525/288 |
| 6,177,519 B1 | 1/2001 | Chung et al. | 525/263 |
| 6,235,848 B1 | 5/2001 | Bickert et al. | 525/326.5 |
| 6,281,288 B1 | 8/2001 | Bickert et al. | 525/72 |
| 6,288,326 B1 | 9/2001 | Hayashi et al. | |
| 6,294,722 B1 * | 9/2001 | Kondo et al. | 136/244 |
| 6,306,954 B1 * | 10/2001 | Nishikawa et al. | 524/514 |
| 6,311,436 B1 * | 11/2001 | Mimura et al. | 52/173.3 |
| 6,335,479 B1 * | 1/2002 | Yamada et al. | 136/251 |
| 6,521,825 B2 * | 2/2003 | Miura et al. | 136/251 |
| 6,673,997 B2 | 1/2004 | Blieske et al. | |
| 2003/0116185 A1 * | 6/2003 | Oswald | 136/251 |

FOREIGN PATENT DOCUMENTS

| | | |
|---|---|---|
| EP | 01 99 233 A1 | 10/1986 |
| EP | 01 99 233 B1 | 1/1990 |
| EP | 0 762 514 A2 | 3/1997 |
| EP | 0 769 818 A2 | 4/1997 |
| EP | 0 054 456 A2 | 11/2000 |
| GB | 20 31 224 | 4/1980 |
| JP | 07249789 A | 9/1995 |
| JP | 10018514 A | 1/1998 |
| JP | 10018515 A | 1/1998 |
| JP | 11054780 | 2/1999 |
| JP | 11340494 A | 12/1999 |
| WO | 97/15619 | 1/1997 |
| WO | WO 97/31769 * | 9/1997 |
| WO | 00 46 860 | 8/2000 |

OTHER PUBLICATIONS

Aurora Solar Cell Technology; "How a Photovoltaic Cell Works"; Internet web site article at http://www.aurorasolarcar.com/celltech.html.

Issue 49—Solar Cells; "Making a Solar Panel"; Internet web site article at http://www.ata.org.au/49solcl2.htm.

Center for Photovoltaic Engineering UNSW—Device Research Reports; "High Efficiency Silicon Solar Cells"; Internet web site article at http://www.pv.unsw.edu.au/94annrep/device.html.

Thin Film Research Laboratory; "Solar Cell"; Internet web site article at http://thinfilm.snu.ac.kr/research/solarcell/htm.

IVF Electronics—EP News—May 99; "IVF and the Grätzel Cell"; Internet web site article at http://www.ivf.se/Elektronic/Ep/EP-News/EPNews992/new299.htm.

Wey; "Polar and Reactive: VESTOPLAST with new Properties"; Paper presented at the Munich Adhesives and Processing Seminar 1997.

Vestoplast Product Information; "Vestoplast 206 V and Vestoplast 206 B."

Written Opinion, Application No. PCT/US03/16691, dated Sep. 14, 2004.

International Search Report; Application No. PCT/US03/16691; dated Apr. 12, 2003.

* cited by examiner

SOLAR PANEL INCLUDING A LOW MOISTURE VAPOR TRANSMISSION RATE ADHESIVE COMPOSITION

FIELD OF THE INVENTION

This invention relates to a solar panel including an adhesive layer including an adhesive composition which has a low moisture vapor transmission rate. The invention also relates to the fabrication of solar panels using such compositions for adhesive and for sealing around module wires and other structural elements of solar panels.

BACKGROUND OF THE INVENTION

Photovoltaic solar panels, also referred to simply as solar panels, are generally of two basic designs. One design employs crystalline silicon wafers connected together and embedded in a laminating film. The laminating film and the wafers embedded therein are typically sandwiched between two lights, or panels, of glass, a polymeric material or other suitable materials.

The second solar panel design, which is of primary interest herein, employs one of amorphous silicon, cadmium-telluride (Cd—Te) or copper-indium-diselenide, $CuInSe_2$ (commonly referred to as "CIS"), or a similar semiconductor material such as mentioned below, which is deposited on a substrate in a thin film. These thin film photovoltaic materials are typically deposited in a thin film on a glass substrate by a method such as sputtering, PVD or CVD. The individual photocells are typically formed by a laser etching process, and are connected together by suitable circuitry, such as a bus bar. The bus bar transfers to a storage device the electrical current output from the photocells. The thin film photovoltaic material and associated circuitry may be covered by a sputtered layer of aluminum, which acts to protect the underlying structures. To complete the construction, an assembly adhesive is applied over the photovoltaic material, associated circuitry, and any protective layer which is present, and a backing material is applied. The backing material is typically glass, but may be metal, a composite or a plastic material.

In addition to the above noted CIS, other combinations of Group I, Group III and Group IV (referred to as I-III-IV) semiconductor materials have been used and/or proposed for use as photovoltaic materials. A number of different I-III-VI semiconductor materials have been proposed for use in photovoltaic cells. Some examples include $AgInS_2$, $AgGaSe_2$, $AgGaTe_2$, $AgInSe_2$, $AgInTe_2$, $CuGaS_2$, $CuInS_2$, $CuInTe_2$, $CuAIS_2$, and $CuGaSe_2$. Most attention, however, has been focused on CIS and variations of CIS in which a portion of the indium is replaced with one or more of aluminum and gallium and/or a portion of the selenium is replaced with sulfur and/or tellurium. Two promising variations of CIS that have been proposed include $CuIn_xGa_{1-x}Se_2$ (commonly referred to as "CIGS") and $CuIn_xGa_{1-x}Se_yS_{2-y}$ (commonly referred to as "CIGSS"). These and other I-III-VI semiconductors may be used in photovoltaic cells, as is known in the art.

The circuitry, such as a bus bar, which collects the electrical current generated by the solar panel must be connected by wiring to a suitable storage device, such as a battery. Such wiring may be referred to as a "module wire" or "module lead". The module wire must exit the solar panel at some point. Additional adhesive or sealant material is needed to seal around the module wire exiting the solar panel. The adhesive used for sealing around module wires may be the same as, or may differ from, the assembly adhesive used to attach the backing material to the solar panel.

Solar panels are used outdoors, and so are exposed to the elements, including wind, water and sunlight. Solar panels are deleteriously affected primarily by moisture which may permeate into the panel, reaching the electrical connections or the photovoltaic materials. Water penetration into solar panels has been a long-standing problem. Thus, various attempts have been made to reduce the moisture vapor transmission rate (MVTR). Solar panels may also be deleteriously affected by wind and sunlight, which may result in failure of the adhesive layer. Wind causes obvious physical damage, and sunlight results in heating of the solar panel and exposure to ultraviolet (UV) radiation. Operating temperatures of solar panels have been measured as high as 110° C. Thermoplastic adhesives soften at elevated temperatures and are susceptible to UV-induced breakdown. Many thermosetting materials suffer from unacceptably high MVTR.

One presently used assembly adhesive is ethylene vinyl acetate (EVA). The EVA is applied to the solar panel together with a peroxide which can crosslink the EVA. The EVA is then cured in place on the solar panel by application of heat or radiation, which causes the peroxide to crosslink the EVA. Crosslinked EVA provides high strength, but suffers from a relatively high MVTR.

Module wire sealing materials suffer from the same problems as do the assembly adhesives. Presently used module wire adhesive/sealants include epoxy compounds and hot melt butyl compounds. Epoxy compounds suffer from relatively high MVTR. The hot melt butyl systems suffer from the inability to achieve high strength since they are generally supplied as a thermoplastic material and they lose strength as temperatures increase, as noted above.

The problems of excluding moisture from solar panels, and of finding adhesives with suitably low MVTR properties, in addition to the other properties required of such adhesives, have been long standing. Many attempts have been made to provide suitable adhesive materials. However, none has satisfactorily provided both the required strength and related properties, and the required low MVTR properties. The present invention provides a solution to this problem by providing a low MVTR adhesive material suitable for use in a solar panel.

SUMMARY OF THE INVENTION

The present invention relates to an adhesive composition suitable for use with solar panels which provides both a low MVTR and strength and related properties.

In one embodiment, the present invention relates to a solar panel including a photovoltaic material layer, a backing panel and an adhesive layer adhering the photovoltaic material layer to the backing panel, in which the adhesive layer comprises an adhesive composition, the adhesive composition comprising a low MVTR polymer or copolymer and a silane-modified polymer or copolymer. In one embodiment, the adhesive layer has a MVTR less than about 3 $g/m^2/d$.

In another embodiment, the present invention relates to a solar panel including a photovoltaic material layer, a backing panel, an adhesive layer adhering the photovoltaic material layer to the backing panel, module wire openings extending through at least one of the photovoltaic material layer or the backing panel, and a module wire adhesive composition sealing the module wire openings, the module wire adhesive composition including a low MVTR polymer or copolymer and a silane-modified polymer or copolymer. In one embodiment, the module wire sealant/adhesive composition has a MVTR less than about 3 $g/m^2/d$.

In one embodiment, the present invention relates to a method of fabricating a solar panel comprising a photovoltaic material layer and a backing panel, the method including steps of (a) forming an adhesive composition having a low moisture vapor transmission rate by combining a low MVTR polymer or copolymer with a silane-modified polymer or copolymer; (b) adhering the photovoltaic material layer to the backing panel using the adhesive composition; and (c) cross-linking the silane-modified polymer or copolymer. In one embodiment, the adhesive composition has a MVTR less than about 3 g/m$^2$d.

The adhesive composition of the present invention provides an advantage in that, in addition to having a low MVTR, due to the presence of excess silane groups on the silane-modified polymer or copolymer, any moisture which may find its way into the adhesive composition merely results in further cross-linking of the silane-modified polymer or copolymer, rather than resulting in any break-down or deterioration of the adhesive composition or other components of the solar panel. Thus, in addition to providing enhanced strength and substrate adhesion to the adhesive composition, the silane-modified polymer or copolymer provides extended protection from any moisture which may penetrate into the adhesive composition.

Figure 1:
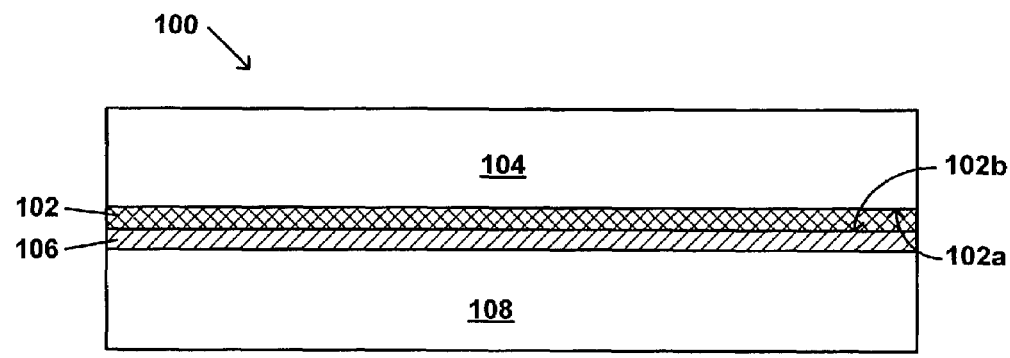
FIG. 1 is a schematic cross-sectional view of layers of a solar panel, including a layer of the low MVTR adhesive material in accordance with the present invention.

It should be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

Furthermore, it should be appreciated that the process steps and structures described below do not form a complete process flow for manufacturing solar panels. The present invention can be practiced in conjunction with solar panel fabrication techniques currently used in the art, and only so much of the commonly practiced process steps are included as are necessary for an understanding of the present invention.

DETAILED DESCRIPTION

In one embodiment, the present invention relates to a solar panel, in which the solar panel includes a photovoltaic material layer and a backing panel, with an adhesive layer adhering the photovoltaic material layer to the backing panel. In one embodiment, the adhesive layer includes an adhesive composition including a low moisture vapor transmission rate (MVTR) polymer or copolymer and a silane-modified polymer or copolymer.

The solar panel may be of any type known in the art. The solar panel thus includes a photovoltaic material layer, for generating an electrical current from sunlight impinging upon the solar panel. In one embodiment, the photovoltaic material layer includes a layer of amorphous silicon, cadmium telluride, copper-indium-diselenide (CIS), or another Group I-III-IV semiconductor material, such as those discussed above.

In another embodiment, the solar panel comprises crystalline silicon wafers connected together and embedded in a laminating film. The crystalline silicon may be polycrystalline or monocrystalline silicon. The present invention is applicable to both of these types of solar panels. In addition, the present invention is applicable to solar panels including other photovoltaic materials, such as gallium arsenide on germanium (GaAs/Ge(i)), gallium arsenide on gallium arsenide (GaAs/GaAs), or gallium indium phosphide on gallium arsenide/germanium (GaInP/GaAs/Ge). The photovoltaic material layers including amorphous silicon, cadmium telluride or copper-indium-sulfide are more susceptible to intrusion of moisture than are the panels including crystalline silicon, so potentially benefit more from the present invention. The present invention is not limited to any particular type of solar panel. Accordingly, for exemplary but non-limiting purposes, photovoltaic material layers including amorphous silicon, cadmium telluride or copper-indium-sulfide, and in particular, amorphous silicon, are described herein.

The photovoltaic material layer is formed on a front panel of material which may be, for example, ordinary borosilicate glass. In another embodiment, the front panel is low-iron glass, which allows more sunlight to pass through the glass. In addition to glass, the front panel (and the backing panel) may be formed of a tough plastic film, such as TEDLAR® brand of polyvinylfluoride (PVF) (a product of E. I. du Pont De Nemours and Co.). PVF, such as TEDLAR® PVF, has a high coefficient of visible light transmission and low coefficient of infrared light transmission so that heat is not transmitted back through the front panel. The front panel should be a material which is not harmed by ultraviolet light since it will be continuously exposed to ultraviolet radiation during daylight hours. Other light transmissive, UV resistant polymers may be used, such as copolymers such as ethylene tetrafluoride-perfluorovinyl ether copolymers (PFA), commercially available as NEOFLON® PFA film from Daikin Industry K. K., ethylene tetrafluoride-propylene hexafluoride copolymers (FEP) commercially available as FEP type Toyoflon film from Toray K.K., and ethylene tetrafluoride-ethylene copolymers (ETFE) commercially available as TEFZEL® ETFE film from E. I. du Pont. In one embodiment, the front panel is glass and the back panel is a material such as TEDLAR® PVF, or another of the polymeric materials. Other suitable materials may be used as the front panel and the backing panel, as known in the art.

The front panel and the photovoltaic material layer are adhered to a backing panel. The backing panel provides additional strength to the solar panel and provides protection to the photovoltaic material layer. The adhesive used to adhere the backing panel to the photovoltaic material layer is an important component of the solar panel, as described in more detail below.

As known in the art, other layers may be included, such as, for example, an anti-reflective coating formed between the front panel and the photovoltaic material layer, to prevent reflection of incoming sunlight out of the solar panel. As known in the art, the photovoltaic material layer may comprise juxtaposed layers of n- and p-doped semiconductor materials which actually generate the electricity from the incoming sunlight.

One embodiment of a typical solar panel 100 in accordance with the present invention is shown in a cross-sectional schematic view in FIG. 1. The solar panel 100 includes a photovoltaic material layer 102. A first surface 102*a* of the photovoltaic material layer 102 is disposed on and attached to a front panel 104. On a second surface 102*b* of the photovoltaic material layer 102 is disposed an adhesive composition layer 106, including a low MVTR adhesive. The adhesive layer 106 forms a bond between the photovoltaic material layer 102 and a backing panel 108.

Figure 2:
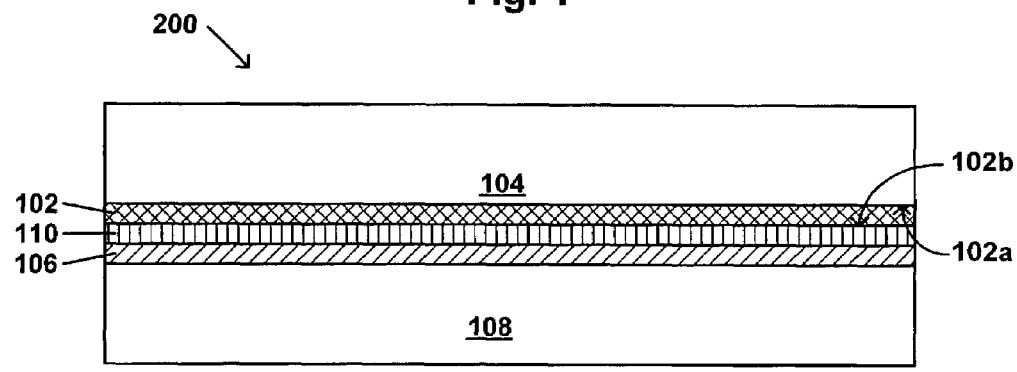
FIG. 2 is a schematic cross-sectional view of layers of a solar panel, similar to FIG. 1, but also including a protective layer, and a layer of the low MVTR adhesive material, in accordance with the present invention.

Another embodiment of a typical solar panel 200 in accordance with the invention is shown in a cross-sectional schematic view in FIG. 2. The solar panel 200 of FIG. 2 includes substantially the same elements of the panel 100 shown in FIG. 1, and further includes a protective layer 110 disposed between the photovoltaic material 102 and the adhesive layer 106. The protective layer may be a metal such as aluminum, which is deposited over the photovoltaic layer 102. The protective material may also be any other material known in the art for this purpose, such as aluminum, copper, gold, silver, alloys of these materials, or another suitably protective metal. In one embodiment, the protective layer 110 is also employed as a current carrier. In such an embodiment, the material of which the protective layer 110 is formed should be conductive, as well as having sufficient strength to provide the desired protection.

A typical solar panel, such as the panel 100, may be fabricated by depositing the photovoltaic material layer 102, e.g., amorphous silicon, on the front panel 104. As noted, the front panel 104 may be formed of any appropriate material, and in many instances the material is glass. The photovoltaic material layer 102 may be deposited by any appropriate means known in the art. For example, amorphous silicon may be deposited by chemical vapor deposition (CVD), by physical vapor deposition (PVD), by sputtering or by any other known method. The CVD methods may include any of a variety of methods, for example, CVD, PECVD, RTCVD, ALCVD, MOCVD or LPCVD.

Figure 3:
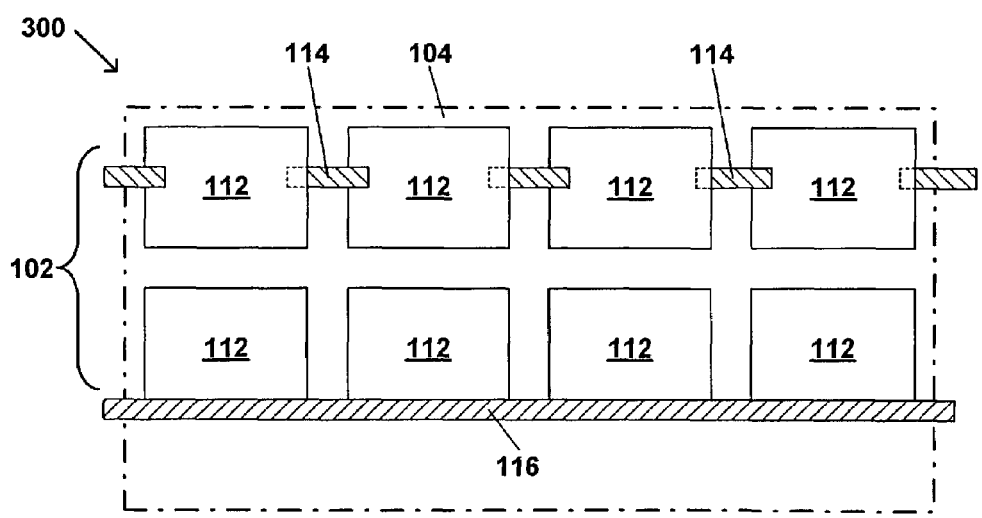
FIG. 3 is a schematic plan view of a solar panel.

FIG. 3 is a plan view of the front panel 104 of a solar panel 300, in accordance with another embodiment of the present invention. The outer border of the front panel 104 is shown in broken lines to indicate that the panel extends beyond the small portion shown in FIG. 3. When the photovoltaic material layer 102 has been deposited on the front panel 104, the photovoltaic layer 102 is etched to define a plurality of individual photocells 112, as shown in FIG. 3. Thus, the plurality of individual photocells 112 shown in plan view in FIG. 3 are substantially the same as the layer 102 shown in cross-sectional view in FIG. 2. The etching may be by application of a laser etching, or by other suitable means, including chemical etching and other etching methods known in the semiconductor arts.

As shown in FIG. 3, the individual photocells 112 must be electrically connected so that the electrical current generated by the photocells can be collected and carried to a location at which the electrical current can be used.

Thus, an electrical connection, such as a bus bar or other suitable wiring, is applied to the solar panel 300 to provide an electrical connection between respective ones of the plurality of individual photocells 112 and the exterior of the solar panel 300. The wiring is connected from one photocell 112 to another as known in the art. FIG. 3 shows two embodiments of such wiring. First, in the upper row of photocells 112 in FIG. 3, there is schematically shown a series of photocell to photocell wiring connections 114. As shown, this series of wiring connections 114 connects from one side a first photocell 112 to the opposite side of an adjacent photocell 112, or to the exterior of the solar panel 300. This side to side connection is indicated by the dashed and solid lines at the point of attachment of the wiring connection 114 to each respective photocell 112. The second embodiment of electrical connection is shown in the lower row of photocells 112, which schematically shows a bus bar 116. The bus bar 116 provides an electrical connection from photocell to photocell and to the exterior of the solar panel 300.

If a protective layer, such as the layer 110 is used, it typically is deposited on the etched, "wired-in" photovoltaic layer 102, which usually is formed on the front panel 104. The protective layer 110 may be deposited by any means which is known in the art for depositing the particular material used, and which is compatible with the material of which the photovoltaic material layer is made.

Thus, for example, the protective layer 110, if a metal, may be deposited by an appropriate CVD method, such as one of those noted above, or by PVD or by sputtering. If the protective material layer 110 is a polymeric material, it may be deposited by a lamination procedure, by direct polymerization on the photovoltaic layer 102, by application of a solvent-free (neat) or solubilized prepolymer, followed by a polymerization thereof, or by any other means known in the art. Other known protective materials may be used, and these may be deposited on the photovoltaic layer 102 by appropriate means.

The adhesive layer 106 may be applied to be in direct contact with the photovoltaic material layer 102 in an embodiment such as shown in FIG. 1. In an embodiment having a protective layer 110, such as shown in FIG. 2, the adhesive layer 106 may be applied in contact with the protective layer 110. In both embodiments, the adhesive layer is also in contact with the backing panel 108. Of course, the adhesive may be initially applied to either the backing panel 108 or to the photovoltaic material layer 102 or the protective layer 110, and then subsequently applied to the opposite layer when the panels are brought into sealing contact. Thus, the adhesive layer 106 is disposed between and adheres together the photovoltaic material layer 102 and the backing panel 104, with the protective layer 110 intervening between these layers in some embodiments.

The adhesive layer 106 is often referred to as an assembly adhesive, since it is used to assemble and hold together the elements of the solar panel. In the present invention, the adhesive layer 106 includes an adhesive composition having a low moisture vapor transmission rate (MVTR). In accordance with one embodiment of the present invention, the adhesive composition includes a low MVTR polymer or copolymer and a silane-modified polymer or copolymer.

In one embodiment, the low MVTR polymer or copolymer includes at least one of a polyisobutylene, an isobutylene-isoprene copolymer, an isobutylene-isoprene-divinylbenzene copolymer, a chlorinated or brominated butyl rubber, an isobutylene-brominated p-methylstyrene copolymer, an isobutylene-p-methylstyrene copolymer, a chlorosulfonated polyethylene, an ethylene-alkyl (meth)acrylate copolymer, an acrylonitrile-butadiene copolymer, a polychloroprene, an epichlorohydrin rubber, or mixtures of two or more thereof. In one embodiment, the low MVTR polymer or copolymer is other than polychloroprene, which in some forms may not provide a satisfactory MVTR.

In one embodiment, the low MVTR polymer or copolymer is polyisobutylene. In one embodiment, the polyisobutylene has a number-average molecular weight in the range from about 20,000 to about 2,000,000. In another embodiment, the polyisobutylene has a number-average molecular weight in the range from about 50,000 to about 500,000. In another embodiment, the polyisobutylene has a number-average molecular weight in the range from about 75,000 to about 300,000.

In one embodiment, the low MVTR polymer or copolymer is a copolymer including monomeric units of isobutylene and another monomer such as isoprene, 1,3-butadiene, p-methylstyrene or other styrene derivatives.

Here and throughout the specification and claims, the limits of the disclosed ranges and ratios may be combined.

In one embodiment, the silane-modified polymer or copolymer includes one or more of a silane-modified amorphous α-olefin polymer or copolymer, a silane-crosslinkable halogenated polymer composition, and a silane grafted copolymer of a monoolefin and a vinyl aromatic monomer.

In one embodiment, the silane-modified amorphous α-olefin polymer or copolymer includes monomeric units of propylene. In another embodiment, the silane-modified amorphous α-olefin polymer or copolymer includes a homopolymer of propylene, or a copolymer of propylene and at least one $C_2$—$C_8$ α-olefin. In another embodiment, the silane-modified amorphous α-olefin polymer or copolymer includes a copolymer of propylene and one or more of maleic anhydride or an alkyl (meth)acrylate.

In one embodiment, the silane-modified amorphous α-olefin polymer or copolymer comprises silyl groups having a structure (I):

$$—Si(OR^1)_n(R^2)_m \quad (I)$$

wherein each $R^1$ independently is a $C_1$—$C_8$ branched or unbranched alkyl group, each $R^2$ independently is either $R^1$ or a $C_1$—$C_8$ branched or unbranched alkyl group, n=1 to 3, m=0 to 2, and m+n=3. Thus, for example, the silyl group may be trimethoxysilyl, triethoxysilyl, or methyldimethoxysilyl. As indicated by the formula, the silyl group may have from one to three $OR^1$ substituents, and may have from zero to two alkyl substituents.

In one embodiment, the adhesive composition includes polyisobutylene as the low MVTR polymer or copolymer and silane-modified amorphous polypropylene as the silane-modified polymer or copolymer.

In one embodiment, the silane-modified polymer or copolymer is a silane-crosslinkable halogenated polymer composition. In one embodiment, the silane-crosslinkable halogenated polymer composition contains a mixture of 100 parts by weight of a halogenated polymer and about 0.1 to about 20 parts by weight of an amino group-containing silane compound. In one embodiment, the composition may be crosslinked in the presence of a silanol catalyst. In one embodiment, the halogenated polymer is one or more of polychloroprene (e.g., Neoprene®), chlorosulfonated polyethylene, epichlorohydrin rubber and halogenated butyl rubber. In one embodiment, the amino group-containing organic silane compound has the following general structure (II):

$$RHNR'Si(OR'')_3 \quad (II)$$

wherein R is hydrogen, an alkyl or a phenyl group, R' is an alkylene group, OR'' is an alkoxy or alkoxyalkoxy group having 1 to 6 carbon atoms. In one embodiment, the aminosilane compound is one or more of N-phenylaminopropyltrimethoxysilane, N-phenylaminopropyltriethoxysilane, N-methylaminopropyltrimethoxysilane, N-ethylaminopropyltriethoxysilane, γ-aminopropyltriethoxysilane or γ-aminopropyltrimethoxysilane.

In one embodiment, the adhesive composition includes polyisobutylene as the low MVTR polymer or copolymer and N-phenylaminopropyltrimethoxysilane modified polychloroprene as the silane-modified polymer or copolymer.

In one embodiment, the silane-modified polymer or copolymer is a silane grafted copolymer of a monoolefin and a vinyl aromatic monomer. In one embodiment, suitable silane grafted copolymer of a monoolefin and a vinyl aromatic monomer comprises copolymers containing at least 50 mole % of at least one $C_3$—$C_7$ monoolefin and from about 0.1 up to 50 mole % of at least one vinyl aromatic monomer. In one embodiment, the vinyl aromatic monomers may be a mono-vinyl aromatic such as styrene, alpha-methylstyrene, alkyl-substituted styrenes such as t-butylstyrene and para-alkyl substituted styrenes wherein the alkyl group contains from 1 to 4 carbon atoms. In one embodiment, the vinyl aromatic compound is p-methylstyrene. Suitable monoolefin monomers include propylene, isobutylene, 2-butene and the like. In one embodiment, substantially 100% of the monoolefinic content of the copolymer comprises isobutylene. In one embodiment, the copolymer comprises isobutylene and para-methylstyrene and contains from about 0.1 to 20 mole % of p-methylstyrene.

In one embodiment, the organic silanes which are reacted with the olefin copolymer to form the silane-grafted copolymer have the general structure (III):

$$RR'SiY_2 \quad (III)$$

wherein R represents a monovalent olefinically unsaturated hydrocarbon or hydrocarbonoxy radical reactive with the free radical sites produced on the backbone polymer, Y represents a hydrolyzable organic radical and R' represents an alkyl or aryl radical or a Y radical. Where R is a hydrocarbonoxy radical, it should be non-hydrolyzable. In one embodiment, R may be a vinyl, allyl, butenyl, 4-pentenyl, 5-hexenyl, cyclohexenyl or cyclopentadienyl radical. In one embodiment, R is vinyl. In one embodiment, the group Y may be one or a mixture of $C_1$ to $C_4$ alkoxy radical such as methoxy, ethoxy or butoxy. In another embodiment, Y is an acyloxy radical, such as formyloxy, acetoxy or propionoxy; or an oximo radical such as —ON=C(CH$_3$)$_2$, —ON=C(CH$_3$)(C$_2$H$_5$) and —ON=C(C$_6$H$_5$)$_2$; or a substituted amino radical such as alkylamino or arylamino radicals, including —NHCH$_3$, —NHC$_2$H$_5$ and —NHC$_6$H$_5$ radicals. In one embodiment, R' represents an alkyl group, an aryl group or a Y group. In one embodiment, the group R' can be exemplified by a methyl, ethyl, propyl, butyl, phenyl, alkylphenyl group or a Y group. In one embodiment, R' is a methyl or alkoxy group. In one embodiment, the silanes are those where R' and Y are selected from methyl and alkoxy groups, e.g., vinyltriethoxysilane, vinyltrimethoxysilane and methyl vinyldimethoxysilane.

In one embodiment, the adhesive composition includes polyisobutylene as the low MVTR polymer or copolymer and a vinyltrimethoxysilane-modified copolymer of isobutylene and para-methylstyrene as the silane-modified polymer or copolymer.

In one embodiment, the silane-modified polymer or copolymer is crosslinked after the adhesive has been applied during the fabrication of the solar panel. In one embodiment, the crosslinking occurs as a result of exposure to atmospheric oxygen or moisture. In this crosslinking reaction, first the alkoxy silyl groups are hydrolyzed to form silanol or hydroxy-silyl compounds, and the hydroxy-silyl groups react with other alkoxy silyl or hydroxy-silyl groups to form cross links including Si—O—Si bonds. The silyl groups may also react with other active hydrogens in the adhesive composition or on the surface of glass panels to which the adhesive attaches. The crosslinking forms a polymer network, through which the low MVTR polymer interpenetrates. Thus, the combined polymers of the adhesive composition create a high strength adhesive which holds the components of the solar panel together, to provide a long service life, and the presence of the low MVTR polymer or copolymer substantially reduces moisture penetration.

The crosslinking reaction transforms the adhesive composition from a thermoplastic-like material, which may be applied as a hot melt or in a low-viscosity state, to a material which is more like a thermosetting polymer. The initial, thermoplastic form of the adhesive composition, prior to crosslinking, has a specific melt flow index range. The melt flow index can be measured, for example, by a method such as ASTM D-1238-A or -B. The crosslinked adhesive composition may not have a measurable melt flow index, since the crosslinking may prevent the adhesive composition from flowing.

In one embodiment, the adhesive composition further includes a crosslinking catalyst. In one embodiment, the crosslinking catalyst may be an organotin compound or a titanate compound. In one embodiment, the crosslinking catalyst includes one or more of dibutyl tin dilaurate, tin oxide, dibutyl tin diacetate, dibutyl tin oxide and a titanate. The crosslinking catalyst promotes the reaction with water to initiate further crosslinking.

In one embodiment, upon crosslinking, the silane-modified polymer or copolymer forms a network with the low MVTR polymer or copolymer interpenetrating therethrough.

In one embodiment, the adhesive composition further includes a crosslinking initiator capable of initiating crosslinking between silyl groups on the silane-modified polymer or copolymer. In general, however, the crosslinking initiator used in the present invention is water. In one embodiment, the water which initiates the crosslinking reaction is atmospheric moisture. As noted above, atmospheric moisture which finds its way into the adhesive composition subsequent to fabrication of the solar panel of the present invention may initiate further crosslinking and/or may react with residual silyl groups present in the adhesive composition.

Figure 4:
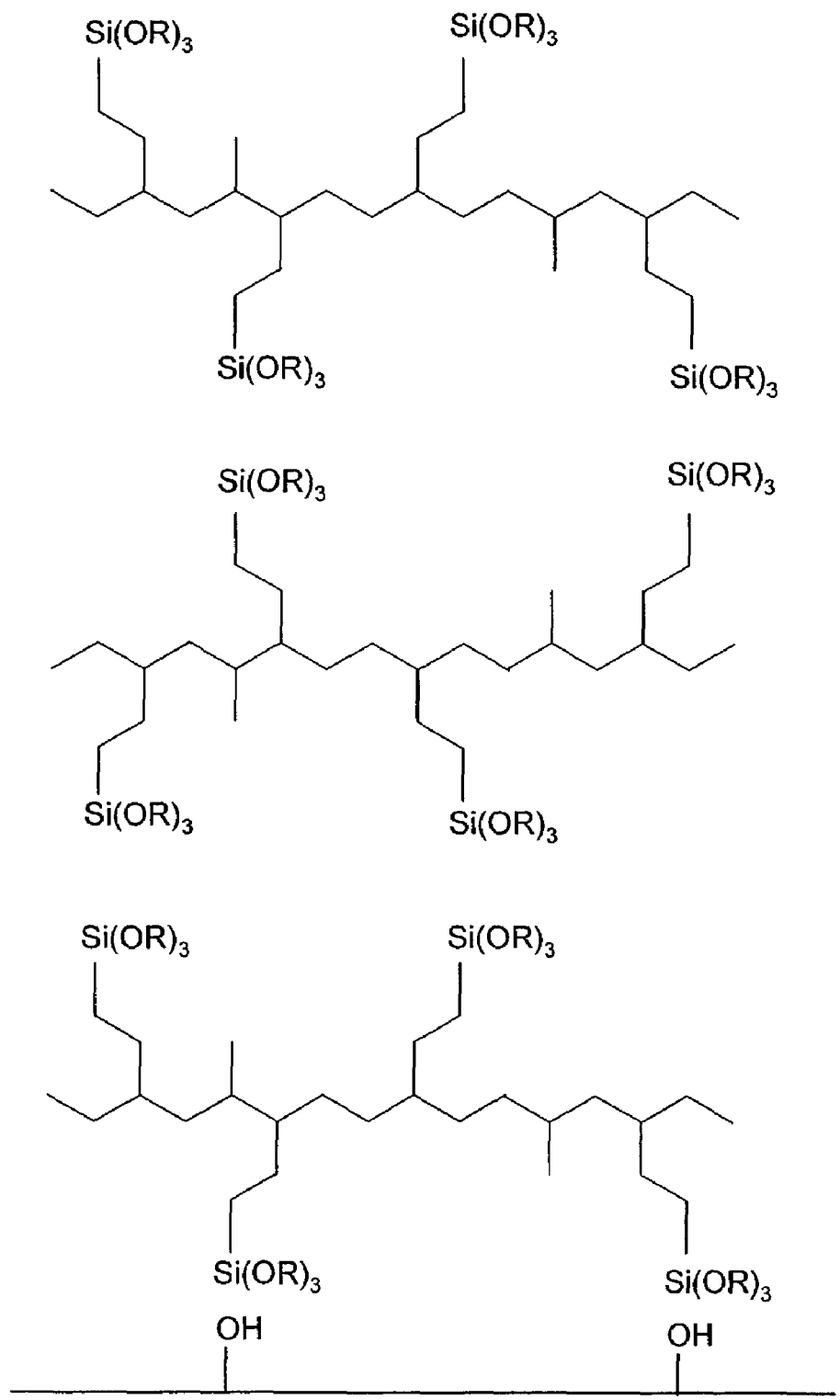
FIG. 4 is a schematic chemical structure of molecules of a silane-modified polymer prior to crosslinking, in accordance with one embodiment of the present invention.

FIG. 4 is a schematic chemical structure of molecules of a silane-modified polymer or copolymer prior to crosslinking, in accordance with one embodiment of the present invention. As shown in FIG. 4, the polymeric chain includes silyl groups attached at various positions on the chain. In the embodiment shown in FIG. 4, the silyl groups are tri-alkoxy (—OR) substituted silyl groups. In one embodiment, the R group of the silyl groups shown in FIG. 4 may be any of the $R^1$ groups defined above. In another embodiment, not shown, the silyl group may be any of the silyl groups defined above in structure (I), e.g., silyl groups having the structure —Si$(OR^1)_n(R^2)_m$, wherein $R^1$, $R^2$, n and m have the meanings set forth above with respect to structure (I).

Figure 5:
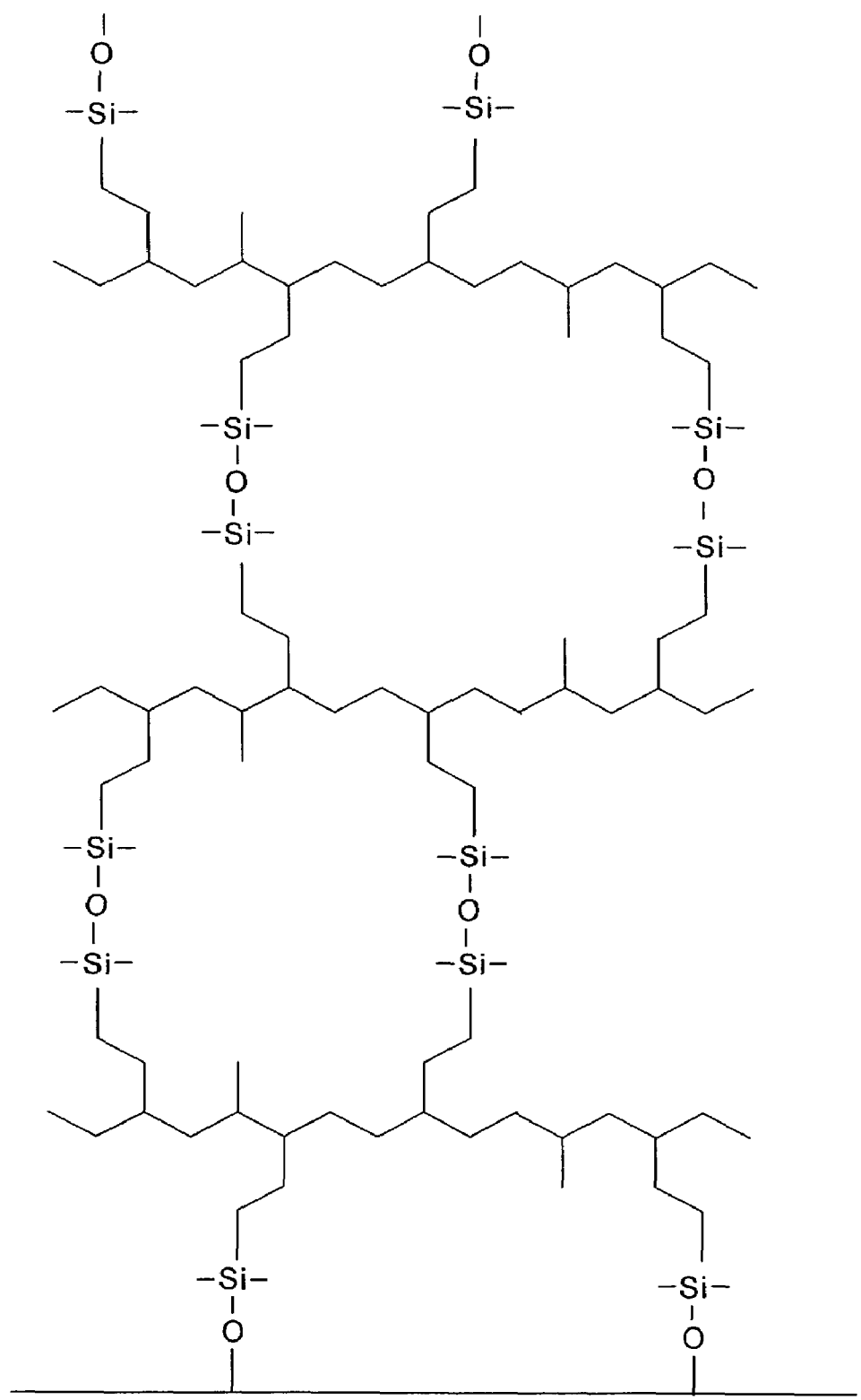
FIG. 5 is a schematic chemical structure of molecules of a silane-modified polymer subsequent to crosslinking, in accordance with one embodiment of the present invention.

FIG. 5 is a schematic chemical structure of molecules of the silane-modified polymer or copolymer such as that of FIG. 4 subsequent to crosslinking, in accordance with one embodiment of the present invention. As shown in FIG. 5, the silyl groups have reacted with each other, and with —OH groups on the surface of a substrate (such as the glass backing layer 108, or the photocell substrate 102). Although not shown in FIG. 5, the remaining —$OR^1$ groups may either remain unreacted or may have reacted with adjacent layers of the silane-modified polymer or copolymer, i.e., into or above the plane of the paper in which the drawing is shown, as suggested by the "empty" bonds extending laterally from the Si atoms.

Although not shown, the other silane-modified polymers or copolymers disclosed herein would form structures analogous to those shown in FIGS. 4 and 5, with appropriate substitution of the polymer backbone and reactive moieties, as defined with respect to structures (II) and (III) above.

Although not shown in FIGS. 4 and 5, in the adhesive layer of the present invention, the low MVTR polymer or copolymer would be in the spaces between the silane-modified polymer or copolymer molecules in both FIG. 4 and FIG. 5 (and in the analogous structures from other silane-modified polymers or copolymers). Thus, as described above, in one embodiment, the adhesive layer includes the silane-modified polymer or copolymer and the low MVTR polymer or copolymer, which together form an interpenetrating network. In one embodiment, the adhesive layer includes the crosslinked silane-modified polymer or copolymer, which forms a network, and the low MVTR polymer or copolymer, which interpenetrates through the network formed by the crosslinked silane-modified polymer or copolymer. The adhesives of the present invention including, in one embodiment, the crosslinked silane-modified polymer or copolymer, and the low MVTR polymer or copolymer, are high strength low MVTR adhesives which both hold together the elements of the solar panel and provide a significant barrier to moisture.

Moisture Vapor Transmission Rate (MVTR) is measured according to ASTM Test Method F 1249-90. In carrying out this ASTM method, the sample is prepared as follows. An adhesive film is pressed into a mold, heated and pressed under vacuum to a thickness from 0.050 to 0.060 inch (1.27 to 1.52 mm). The vacuum is used during the heating and pressing operation to insure that the film is created without air voids or bubbles. After the film is removed from the press cavity it may be cured via exposure to moisture in a high humidity environment. It is not necessary to cure the film prior to testing for MVTR, as the MVTR value for a cured film or an uncured film is nearly the same, since MVTR of elastomeric adhesives is believed to be more related to the backbone of the polymers in the film than to the crosslink density of the polymer. In order to facilitate the ease of handling of the laminating adhesive film, a five square centimeter die-cut aluminum mask is used to hold the film. The mask, available from the equipment manufacturer MOKON, Buffalo, N.Y., is designed to hold the film in the test chamber. The die-cut aluminum mask has a five square centimeter (5 cm$^2$) opening cut into it that allows the testing to proceed. A sample of the low MVTR adhesive composition film is placed onto a die-cut aluminum mask. A second die-cut aluminum mask is placed over the first with the adhesive composition film in between. This now rigid structure can easily be placed into the testing chamber and the MVTR tested on the 5 cm$^2$ sample exposed in the mask, according to the ASTM method.

As used herein, the term "low MVTR" or "low moisture vapor transmission rate" means that the rate at which water vapor or moisture is transmitted through the material to which this term is applied, as measured by ASTM F 1249-90, is less than 5 grams per square meter per day (g/m$^2$/d). This rate of moisture vapor transmission is generally regarded as "low".

In one embodiment, the adhesive composition has a moisture vapor transmission rate (MVTR) less than about 3 g/m$^2$/ d. In one embodiment, the adhesive composition has a MVTR less than about 1 g/m²/d. While ideally the minimum MVTR of the adhesive composition would be zero, in one embodiment, the lowest MVTR is about 0.05 g/m²/d for a low MVTR polymer such as PIB. Thus, in one embodiment, the MVTR of the adhesive composition of the present invention is in a range from about 0.075 to about 5 g/m²/d. In another embodiment, the MVTR of the adhesive composition of the present invention is in a range from about 0.1 to about 3 g/m²/d. In another embodiment, the MVTR of the adhesive composition of the present invention is in a range from about 0.5 to about 2 g/m²/d.

In one embodiment, the adhesive composition further includes a filler. In one embodiment, the filler includes calcium carbonate, talc, barium sulfate, clay, silica, carbon black, titanium dioxide, and a mixture of two or more thereof.

Since the adhesive composition should be non-conductive, i.e., a dielectric material, the filler materials used should either be non-conductive or if possibly conductive, should be used at a level which does not result in the adhesive composition having a dielectric strength of less than about $1 \times 10^8$ ohm-cm, as determined by ASTM D 257. A typical, desirable dielectric strength for the adhesive material is about $1 \times 10^9$ ohm-cm, as determined by ASTM D 257.

In one embodiment, the adhesive composition further includes an adhesion promoter. In one embodiment, the adhesion promoter includes one or more of a silane, a titanate, a zirconate and a zirco-aluminate.

In one embodiment, the silane adhesion promoting compounds include vinyl silanes, amine-substituted alkyl or alkyl/alkoxy silanes, and other known adhesion promoting silane compounds. In one embodiment, the silane adhesion promoting compounds include silanes having a general structure (IV):

$$Si(OR^1)_n(R^2)_m \qquad (IV)$$

wherein each $R^1$ independently is a $C_1$—$C_8$ branched or unbranched alkyl group, each $R^2$ independently is either $R^1$ or a $C_1$—$C_8$ branched or unbranched, substituted or unsubstituted alkyl group or halogen, n=1 to 3, m=1 to 3, and m+n=4. The substitution of the alkyl group may comprise, for example, primary or secondary amines and the halogens. Thus, for example, the silyl group may be trimethoxysilyl, triethoxysilyl, methyldimethoxysilyl, trimethoxychlorosilane, γ-aminopropyltrimethoxysilane or γ-chlorobutyltriethoxysilane. As indicated by the formula, the silyl group may have from one to three $OR^1$ substituents, and may have from one to three $R^2$ substituents.

In one embodiment, the titanate and zirconate adhesion promoting compounds typically have large (e.g., about 5 to about 20 carbon atoms) hydrocarbon or substantially hydrocarbon groups attached to a central titanium or zirconium atom. Thus, in one embodiment, these titanate and zirconate adhesion promoting compounds contain from about 5 to about 100 carbon atoms, and in one embodiment from about 20 to about 60 carbon atoms. "Substantially hydrocarbon" describes groups which contain heteroatom substituents which do not alter the predominantly hydrocarbon nature of the group. The heteroatom substituents containing non-hydrocarbon groups which, in the context of this invention, do not alter the predominantly hydrocarbon nature of the substituent, include groups such as chloro and fluoro; those skilled in the art will be aware of such groups. In general, no more than about 2, and in one embodiment, no more than one, heteroatom substituents are present for every ten carbon atoms in the hydrocarbon group. Typically, there are no such heteroatom substituents in the hydrocarbon group.

Suitable zirco-aluminate adhesion promoting compounds are commercially available from Rhone-Poulenc. Preparation of aluminum-zirconium complexes is described in the U.S. Pat. Nos. 4,539,048 and 4,539,049. These patents describe zirco-aluminate complex reaction products corresponding to the empirical formula (V):

$$(Al_2(OR_1O)_aA_bB_c)_X(OC(R_2)O)_Y(ZrA_dB_e)_Z \qquad (V)$$

wherein X, Y, and Z are at least 1, $R_2$ is an alkyl, alkenyl, aminoalkyl, carboxyalkyl, mercaptoalkyl, or epoxyalkyl group, having from 2 to 17 carbon atoms, and the ratio of X:Z is from about 2:1 to about 5:1. Additional zirco-aluminate complexes are described in U.S. Pat. No. 4,650,526. The disclosure of these three patents relating to zirco-aluminate adhesion promoting compounds is incorporated herein by reference.

In one embodiment, the adhesive composition further includes a plasticizer. In one embodiment, the plasticizer includes one or more of a hydrocarbon oil, an ester derivative of a dibasic acid, a mineral oil, a paraffin, a paraffin derivative and a polybutene.

In one embodiment, the adhesive composition further includes a tackifying resin. In one embodiment, the tackifying resin includes one or more of a rosin ester, a polyterpene, a polyterpene derivative, a $C_5$ hydrocarbon resin, a $C_9$ hydrocarbon resin, a phenolic resin and a natural resin.

In one embodiment, the solar panel further includes module wire openings and a module wire adhesive composition sealing the module wire openings. In one embodiment, the module wire adhesive composition includes a low MVTR polymer or copolymer and a silane-modified polymer or copolymer, but has a different formulation than that in the adhesive layer disposed between and adhering together the photovoltaic material layer and the backing panel.

Thus, in one embodiment, the present invention further relates to a solar panel including a photovoltaic material layer; a backing panel; module wire openings in at least one of the photovoltaic material layer or the backing panel; and a module wire sealant/adhesive composition sealing the module wire openings, the module wire sealant/adhesive composition, the sealant/adhesive composition comprising a low MVTR polymer or copolymer and a silane-modified polymer or copolymer. In one embodiment, the module wire adhesive is the same adhesive as that used for the assembly adhesive. In another embodiment, the module wire adhesive has a different formulation from that of the assembly adhesive.

Figure 6:
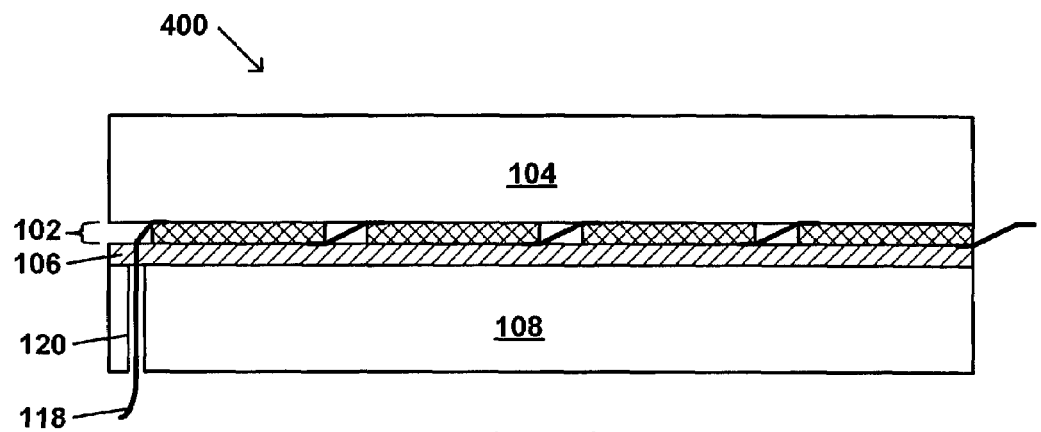
FIG. 6 is a schematic cross-sectional view of a solar panel including a module wire opening in accordance with an embodiment of the present invention.

FIG. 6 is a schematic cross-sectional view of a solar panel including a further embodiment of the present invention. FIG. 6 shows a solar panel 400 which includes the same elements described above with respect to FIGS. 1-3, and further includes a module wire 118 and a module wire opening 120. As shown in FIG. 6, in one embodiment, the module wire opening 120 extends through the backing layer 108, to form a passageway through which the module wire 118 extends outside of the solar panel 400. The module wire 118 thus provides an electrical connection from the plurality of individual photocell elements 112, which generate the electrical current, to the outside, where the electrical current is used.

Figure 7:
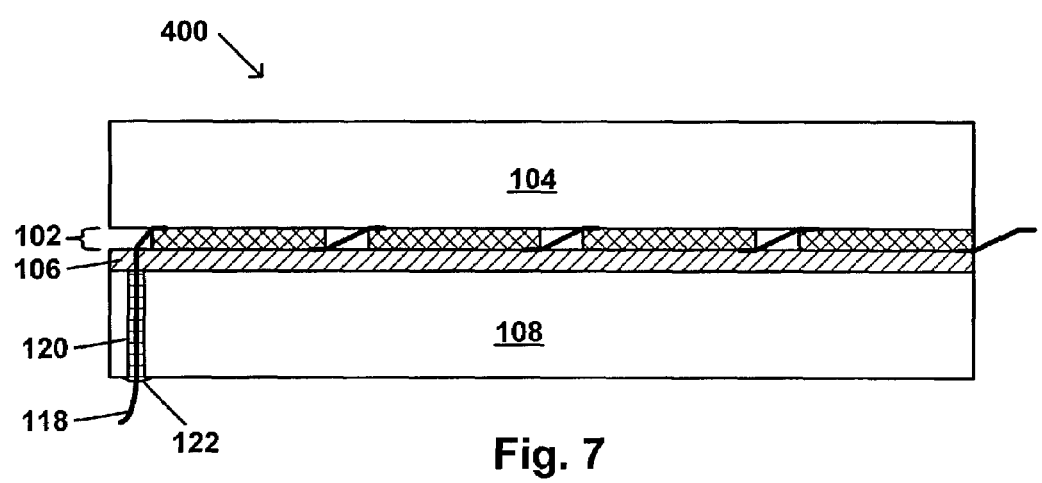
FIG. 7 is a schematic cross-sectional view of the solar panel of FIG. 6 including the module wire opening filled with a module wire adhesive in accordance with an embodiment of the present invention.

FIG. 7 is a schematic cross-sectional view of a solar panel 400 such as that shown in FIG. 6, which further includes a module wire adhesive 122 sealing the module wire 118 and the module wire opening 120. In one embodiment, the module wire adhesive 122 is a low MVTR adhesive in accordance with the present invention. In one embodiment, the module wire adhesive 122 is the same adhesive as that described above for use as the assembly adhesive 106. In one embodiment, the module wire adhesive 122 comprises a greater proportion level of the low MVTR polymer or copolymer component, relative to the proportion of the silane-modified polymer or copolymer. Since the module wire adhesive does not need the high strength needed by the assembly adhesive, it is possible to increase the loading of the MVTR polymer or copolymer component in the adhesive composition relative to the silane-modified polymer or copolymer component. This modification is of benefit in further reducing the absolute amount of moisture which successfully enters the solar panel due to the increase in loading of the MVTR polymer or copolymer. This modification is also of benefit since the reduced amount of silane-modified polymer or copolymer allows the module wire adhesive 122 to be softer and therefore more compliant to the possible movements of the module wire 118 without the danger of creating a direct passageway through which moisture may enter the interior of the solar panel.

In some embodiments (not shown), a frame, such as an aluminum frame, may be formed around the solar panel. Such a frame provides stability and locations at which mounting may be made. The frame may be sealed to the solar panel by an appropriate adhesive. In one embodiment, the frame is sealed to the solar panel by a low MVTR adhesive composition, such as that of the present invention. In one such embodiment, the low MVTR adhesive composition used to adhere the frame to the solar panel is the assembly adhesive described above. In another embodiment, the low MVTR adhesive composition used to adhere the frame to the solar panel is the module wire adhesive described above. In both embodiments in which the frame is adhered to the solar panel with the low MVTR adhesive composition, additional protection from moisture vapor penetration is provided to the solar panel by the adhesive and the frame.

In other embodiments, the frame is sealed to the solar panel by an adhesive such as a butyl hot melt adhesive, as is known in the art and commonly used for this purpose. In addition, in some embodiments, a butyl hot melt adhesive may be used as the module adhesive for sealing around the module wires.

Method of Fabricating a Solar Panel

In one embodiment, the present invention relates to method of fabricating a solar panel comprising a photovoltaic material layer and a backing panel, the method including steps of (a) forming an adhesive composition having a low moisture vapor transmission rate by combining a low MVTR polymer or copolymer with a silane-modified polymer or copolymer, (b) adhering the photovoltaic material layer to the backing panel using the adhesive composition, and (c) cross-linking the silane-modified polymer or copolymer. In one embodiment, upon crosslinking, the silane-modified polymer or copolymer forms a network with the low MVTR polymer or copolymer interpenetrating therethrough.

In one embodiment, step (b) includes applying a layer of the adhesive composition over the photovoltaic materials.

In one embodiment, the solar panel comprises module wire openings, and the method further includes applying the adhesive composition to the module wire openings.

Figure 8:
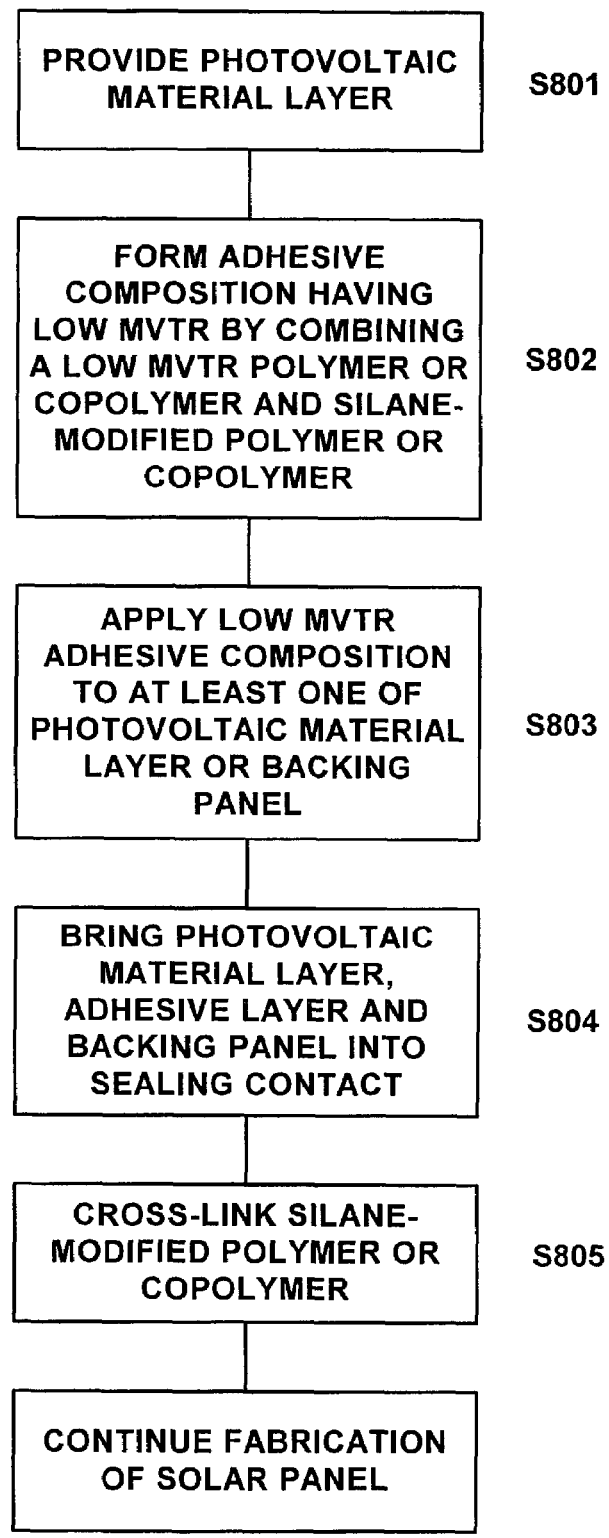
FIG. 8 is a flow diagram schematically illustrating the steps of a method of fabricating a solar panel in accordance with an embodiment of the present invention.

FIG. 8 is a flow diagram schematically illustrating the steps of a method of fabricating a solar panel in accordance with the present invention. As shown in FIG. 8, in the first step of the method, shown as step S801, a photovoltaic layer is provided. In the usual case, the photovoltaic layer will have been deposited by an appropriate process to one surface of a front panel, such as that described above. In addition, the photovoltaic layer usually will have been separated into individual photovoltaic cells, or photocells. Each of the photocells will have been electrically connected, as appropriate to the design of the solar cell. Such matters may be appropriately designed or selected by those of skill in the art, and the present invention is not limited to any particular form of photovoltaic material layer.

In the second step of the method, shown in FIG. 8 as step S802, an adhesive composition having a low MVTR is formed. The low MVTR adhesive composition is formed by combining a low MVTR polymer or copolymer with a silane-modified polymer or copolymer. In one embodiment, a suitable crosslinking catalyst is included in the mixture of the low MVTR polymer or copolymer and silane-modified polymer or copolymer.

The low MVTR polymer or copolymer may be any of the materials disclosed above. In one embodiment, the low MVTR polymer or copolymer is a polymer or copolymer of isobutylene, and in one embodiment, the low MVTR polymer is polyisobutylene.

The silane-modified polymer or copolymer may be any of the polymers or copolymers disclosed above, and the silyl group with which the polymer or copolymer is modified may be any of the silyl groups disclosed above. In one embodiment, the polymer or copolymer comprises propylene, and in one embodiment, the polymer is amorphous polypropylene. In one embodiment, the silyl group is a trimethoxysilyl group, a triethoxysilyl group, an alkyl derivative of the trimethoxysilyl group or the triethoxysilyl group, an aminoalkoxysilane, or an unsaturated organic silane such as vinyltrimethoxysilane, or a mixture of any two or more of these silyl groups, or any of the silanes disclosed herein.

The step S802 may be carried out in a suitable mixing apparatus, such as a Banbury mixer. In one embodiment, the mixing step is carried out under low-moisture conditions, to avoid premature crosslinking of the silane-modified polymer or copolymer. In another embodiment, the mixing step is carried out under an inert gas atmosphere, to avoid premature crosslinking of the silane-modified polymer or copolymer. The inert gas may be, for example, nitrogen. In another embodiment, the mixing step is carried out in an atmosphere of dried air, in which the air has been dried by, e.g., chilling, to avoid premature crosslinking of the silane-modified polymer or copolymer. In any embodiment, it is prudent to handle the silane-modified polymer or copolymer under conditions which avoid premature crosslinking.

When the low MVTR adhesive composition has been formed by thoroughly mixing the ingredients, it is ready to be applied.

As shown in FIG. 8, in the third step of the present invention, shown as step S803, the low MVTR adhesive composition is applied to at least one of the photovoltaic material layer and the backing panel. As described above, the low MVTR adhesive composition may be applied to either or both of the front panel or the backing panel. In an embodiment in which the low MVTR adhesive is applied to the front panel, it is applied to and over either the photovoltaic layer or the protective layer, depending on whether the protective layer is present.

Application of the low MVTR adhesive composition to the selected layer or panel may be by any appropriate method known in the art. For example, the low MVTR adhesive composition may be applied by spraying, extrusion, spreading with an appropriate device such as a doctor blade, and other methods such as a transfer film such as a release liner. A suitable release liner should have little or no water content. Thus, a suitable material for a release liner would be a polyolefin or polyethylene treated with a suitable release agent. In one embodiment, nylon is not suitable for the release liner, as it may contain residual water or other active hydrogen sources.

As shown in FIG. 8, in the fourth step of the present invention, shown as step S804, the respective layers are brought together, into sealing contact. Thus, the photovoltaic material layer, the low MVTR adhesive composition layer and the backing panel, are brought together to form a single unit. In one embodiment, the low MVTR adhesive composition is sufficiently tacky to hold the front panel and the backing panel together. The photovoltaic material layer, the low MVTR adhesive composition layer and the backing panel, are brought together in the presence of at least one of pressure, vacuum and heat. Application of such forces helps the adhesive to wet the surfaces to which it will be attached, to provide an intimate, complete attachment. The adhesive should be applied in a manner so as to avoid the formation of air pockets or bubbles between the respective front and back panels. As is known in the art, such air pockets or bubbles can lead to failure of the solar panel in use.

As shown in FIG. 8, in the fifth step of the present invention, shown as step S805, the low MVTR adhesive composition is crosslinked by a reaction of the silane-modified polymer or copolymer. In one embodiment, the crosslinking is initiated by atmospheric moisture. In one embodiment, the low MVTR adhesive composition further comprises a suitable crosslinking catalyst, such as any of those disclosed above. In an embodiment including such a catalyst, the crosslinking reaction is accelerated by the catalyst. In the absence of the catalyst, the crosslinking reaction may be quite slow.

In one embodiment, crosslinking of the low MVTR adhesive composition is initiated by exposure of the low MVTR adhesive composition to atmospheric moisture during or after the assembly of the solar panel.

In one embodiment, as noted above, the solar panel includes module wire openings, through which module wires extend. In such an embodiment, the low MVTR adhesive composition may be inserted into the module wire openings at a suitable time during assembly of the solar panel. As noted above, the module wire adhesive may have the same composition as that of the assembly adhesive, or it may have a composition which includes a greater proportion of the low MVTR polymer or copolymer. Both embodiments of the composition used for the module wire adhesive are referred to in the following as the module wire adhesive.

In general, as the solar panel is assembled, the module wires 118 are first electrically connected to the photovoltaic layer 102. When the backing panel 108 and the front panel 104 (together with the photovoltaic layer 102) are brought together, the module wire 118 will extend through the applied adhesive layer 106 and into and through the module wire openings 120. The module wire openings 120 may be filled with the module wire adhesive 122 at any appropriate time.

In one embodiment, the module wire adhesive 122 is applied to the module wire openings 120 at the same time the low MVTR assembly adhesive 102 is applied to the surface of the backing panel 108. However, this would require passing the module wire 118 through the adhesive-filled module wire opening 120, which may not be desirable. In another embodiment, the module wire adhesive 122 is applied to fill the module wire openings 120 after the front panel 104 and the backing panel 108 have been brought into sealing contact, but prior to the initiation of crosslinking of the silane-modified polymer or copolymer. In yet another embodiment, the module wire adhesive 122 may be applied after crosslinking has been initiated. In an embodiment in which the crosslinking is initiated by contact with atmospheric moisture during the assembly, the module wire adhesive 122 will be applied after initiation of the crosslinking, since the crosslinking will have been initiated immediately upon exposure of the low MVTR adhesive composition to the atmospheric moisture.

As shown in FIG. 8, once the crosslinking reaction has been initiated, fabrication of the solar panel may continue. It is noted that the crosslinking reaction may continue for some time. In one embodiment, the crosslinking reaction continues for a period of hours after the crosslinking has been initiated. In another embodiment, the crosslinking reaction continues for a number of days or weeks. In another embodiment, the crosslinking reaction continues indefinitely, slows to a negligible rate and may be reinitiated or accelerated at some later time as result of the ingress of moisture into the low MVTR adhesive composition.

EXAMPLES

The following examples relate to the adhesive compositions for use with the solar panels of the present invention, their formulation and testing. While the tests are applied to test panels, they are considered to be fully applicable to the solar panels described herein. In each case, the indicated formulations are prepared from the indicated source materials in the manner described above, that is, generally in the absence of moisture with appropriate mixing. These examples are illustrative and not intended to be limiting in scope.

Formulation Examples

The following formulation examples include a low MVTR polymer and a silane-modified APAO in accordance with the present invention:

| Ingredient | A | B | C | D | E | F | G | H | I | J |
| --- | --- | --- | --- | --- | --- | --- | --- | --- | --- | --- |
| Polyisobutylene Rubber | 16.00 | 0.00 | 10.00 | 33.00 | 10.00 | 10.00 | 10.00 | 0.00 | 10.00 | 10.00 |
| Filler | 34.00 | 0.00 | 0.00 | 33.00 | 80.00 | 30.00 | 30.00 | 33.00 | 45.00 | 40.00 |
| Hydrocarbon Resin | 10.00 | 0.00 | 0.00 | 0.00 | 0.00 | 5.00 | 25.00 | 15.00 | 0 | 10.00 |
| Semi-solid PIB | 6.00 | 10.00 | 0.00 | 0.00 | 0.00 | 5.00 | 0.00 | 18.00 | 0.00 | 5.00 |
| Silane | 0.20 | 0.00 | 0.00 | 0.00 | 0.00 | 0.20 | 0.00 | 0.00 | 0.00 | 0.20 |
| Catalyst | 0.05 | 0.00 | 0.00 | 0.05 | 0.05 | 0.05 | 0.05 | 0.05 | 0.05 | 0.05 |
| Silane-modified APAO | 34.00 | 90.00 | 90.00 | 34.00 | 10.00 | 50.00 | 35.00 | 34.00 | 45.00 | 35.00 |
| TOTAL | 100.25 | 100.00 | 100.00 | 100.05 | 100.05 | 100.25 | 100.05 | 100.05 | 100.05 | 100.00 |

The materials used in the foregoing Formulation Examples are the following:

| | |
|---|---|
| Polyisobutylene Rubber | BUTYL ® 268 (isobutylene-isoprene copolymer) |
| Filler | CaCO$_3$ |
| Hydrocarbon Resin | FORAL ® 85 or ECR 158 |
| Semi-solid PIB | OPPANOL ® B-12 (polyisobutylene) |
| Silane | SILQUEST ® A1120 Silane (aminopropyltrimethoxysiane) |
| Catalyst | Dibutyl tin dilaurate (DBTDL) |
| Silane-modified APAO | VESTOPLAST ® 206 V |

HYPALON ® Based Laminating Adhesive

| Name | Wt. % |
|---|---|
| HYPALON ® H-30 | 22.8 |
| Semi-solid polyisobutylene | 6.8 |
| Hydrocarbon Resin | 11.4 |
| VESTOPLAST ® 206 V | 26.4 |
| Talc | 22.8 |
| Hydrogenated Rosin Ester | 3.6 |
| Polymeric polyester plasticizer | 5.7 |
| Tin Catalyst | 0.03 |
| Silane | 0.5 |
| TOTAL | 100.0 |

HYPALON ® is a chlorosulfonated polyethylene available from DuPont, USA.

VAMAC based laminating adhesive

| Name | Wt. % |
|---|---|
| VAMAC ® G (DuPont) | 24.1 |
| CaCO$_3$ | 17.4 |
| Polymeric polyester plasticizer | 6.9 |
| Hydrogenated Rosin Ester | 18.8 |
| VESTOPLAST ® 206 V | 32.3 |
| Tin Catalyst (Dibutyl tin dilaurate) | 0.03 |
| Silane | 0.5 |
| TOTAL | 100.0 |

VAMAC ® G is believed to be an ethylene/methyl acrylate copolymer containing carboxyl groups, commercially available from DuPont, USA.

Nitrile Based Laminating Adhesive

| Name | Wt. % |
|---|---|
| NIPOL ® 1072CG (Nippon Zeon) | 24.1 |
| Talc | 17.4 |
| Polymeric polyester plasticizer | 6.9 |
| Hydrogenated Rosin Ester | 18.8 |
| VESTOPLAST ® 206 V | 32.3 |
| Tin Catalyst | 0.03 |
| Silane | 0.5 |
| TOTALS | 100.0 |

NIPOL ® 1072G is believed to be a carboxylic acid functional nitrile rubber, available from Zeon Chemicals, Inc., Louisville, Ky.

Adhesive Composition with Two Silane-modified Polymers

| Name | Wt. % |
|---|---|
| Silane-crosslinkable composition of epichlorohydrin rubber and N-phenylaminopropyltrimethoxysilane* | 6.8 |
| Semi-solid polyisobutylene | 22.8 |
| Hydrocarbon Resin | 11.4 |
| VESTOPLAST ® 206 V | 26.4 |
| Talc | 22.8 |
| Hydrogenated Rosin Ester | 3.6 |
| Polymeric polyester plasticizer | 5.7 |
| Tin Catalyst | 0.03 |
| Silane | 0.5 |
| TOTAL | 100.0 |

*The silane-crosslinkable composition is prepared by reacting about 5 wt % of the N-phenylaminopropyltrimethoxysilane with about 95 wt % of the epichlorohydrin rubber.

Adhesive Composition with Silane-modified Polymer

| Name | Wt. % |
|---|---|
| Silane-crosslinkable composition of epichlorohydrin rubber and N-phenylaminopropyltrimethoxysilane* | 22.8 |
| Semi-solid polyisobutylene | 6.8 |
| Hydrocarbon Resin | 11.4 |
| VESTOPLAST ® 750 APAO | 26.4 |
| Talc | 22.8 |
| Hydrogenated Rosin Ester | 3.6 |
| Polymeric polyester plasticizer | 5.7 |
| Tin Catalyst | 0.03 |
| Silane | 0.5 |
| TOTAL | 100.0 |

*The silane-crosslinkable composition is prepared by reacting about 5 wt % of the N-phenylaminopropyltrimethoxysilane with about 95 wt % of the epichlorohydrin rubber.

Adhesive Composition with Two Silane-modified Polymers

| Name | Wt. % |
|---|---|
| Silane-crosslinkable composition of HYPALON ® H-30 rubber and N-phenylaminopropyltrimethoxysilane* | 6.8 |
| Semi-solid polyisobutylene | 22.8 |
| Hydrocarbon Resin | 11.4 |
| VESTOPLAST ® 206 V | 26.4 |
| Talc | 22.8 |
| Hydrogenated Rosin Ester | 3.6 |
| Polymeric polyester plasticizer | 5.7 |
| Tin Catalyst | 0.03 |
| Silane | 0.5 |
| TOTAL | 100.0 |

*The silane-crosslinkable composition is prepared by reacting about 5 wt % of the N-phenylaminopropyltrimethoxysilane with about 95 wt % of the HYPALON ® H-30 rubber.

| Adhesive Composition with Silane-modified Polymer | |
| --- | --- |
| Name | Wt. % |
| Silane-crosslinkable composition of HYPALON® H-30 rubber and N-phenylaminopropyltrimethoxysilane* | 22.8 |
| Semi-solid polyisobutylene | 6.8 |
| Hydrocarbon Resin | 11.4 |
| VESTOPLAST® 750 APAO | 26.4 |
| Talc | 22.8 |
| Hydrogenated Rosin Ester | 3.6 |
| Polymeric polyester plasticizer | 5.7 |
| Tin Catalyst | 0.03 |
| Silane | 0.5 |
| TOTAL | 100.0 |

*The silane-crosslinkable composition is prepared by reacting about 5 wt % of the N-phenylaminopropyltrimethoxysilane with about 95 wt % of the HYPALON® H-30 rubber.

| Adhesive Composition with Two Silane-modified Polymers | | |
| --- | --- | --- |
| Material | Batch Wt. | % Wt. |
| Silane grafted copolymer of isobutylene and p-methylstyrene** | 441.7 | 16.4 |
| ECR 158 | 242.9 | 9.0 |
| FORAL® 85 | 26.3 | 1.0 |
| CaCO₃ | 904.5 | 33.5 |
| B-12 PIB | 147.5 | 5.5 |
| VESTOPLAST® 206 V | 930.8 | 34.5 |
| DBTDL | 0.9 | 0 |
| A186 Silane | 2.7 | 0.1 |
| Vinyl Silane | 2.7 | 0.1 |
| TOTAL | 2700 | 100.1 |

| Adhesive Composition with Silane-Modified Polymer | | |
| --- | --- | --- |
| Material | Batch Wt. | % Wt. |
| Silane-grafted copolymer of isobutylene and p-methylstyrene** | 261.8 | 16.4 |
| ECR 158 | 144.0 | 9.0 |
| FORAL® 85 | 15.6 | 1.0 |
| CaCO₃ | 536.0 | 33.5 |
| B-12 PIB | 87.4 | 5.5 |
| VESTOPLAST® 750 | 551.6 | 34.5 |
| DBTDL | 0.5 | 0 |
| A186 Silane | 1.6 | 0.1 |
| Vinyl Silane | 1.6 | 0.1 |
| TOTAL | 1600.1 | 100.1 |

**In the foregoing examples, the silane-grafted copolymer of isobutylene and p-methylstyrene is prepared by reacting 88 wt % of a isobutylene-p-methylstyrene copolymer with 12 wt % of vinyltrimethoxysilane.

In the foregoing formulation examples, the following raw materials are used:

| Raw Material Definitions | |
| --- | --- |
| Semi-solid Polyisobutylene | OPPANOL® B-12 (BASF) |
| Hydrocarbon Resin | ESCOREZ® 1315 (Exxon) |
| Hydrogenated Rosin Ester | FORAL® 105 (Hercules) |
| Talc | MISTRON® Vapor Talc (Luzenac) |
| Calcium Carbonate | HUBERCARB® Q-6 (JM Huber) |
| Polymeric Polyester Plasticizer | PARAPLEX® G 25 (CP Hall) |
| Tin Catalyst | METACURE® T12 (Air Products and Chemicals, Inc.) |
| Vinyltrimethoxysilane | A-171 Vinyl Silane (OSi Specialties) |
| N-phenylaminopropyltrimethoxy silane | Y-9669 (OSi Specialties) |
| Epichlorohydrin Rubber | Hydrin CG® (Zeon Chemicals) |

Strength Tests of Adhesive Compositions Comprising Silane-Modified APAO:

The following formulation, similar to formulation example A shown above, is prepared and tested for tensile strength and lap shear strength after various periods of time following bonding of a front panel and a back panel during fabrication of an exemplary solar panel. The tensile strength tests are conducted according to ASTM D 412-87. The lap shear strength tests are conducted according to ASTM C 961-87.

| Name | Ingredient | Weight | Wt % |
| --- | --- | --- | --- |
| BUTYL® 268 | Polyisobutylene Rubber | 420 | 16.3 |
| CaCO₃ | Filler | 860 | 33.4 |
| FORAL® 85 | Hydrocarbon Resin | 25 | 1.0 |
| ECR 158 | Hydrocarbon Resin | 231 | 9.0 |
| BASF B-12 | Semi-solid polyisobutylene | 140 | 5.4 |
| A1120 Silane | Silane | 12.5 | 0.5 |
| DBTDL | Catalyst | 0.4 | 0.2 |
| VESTOPLAST® | Silane-modified APAO | 885 | 34.4 |
| | TOTAL | 2573.9 | 100.2 |

Test Results:

The foregoing formulation is applied to test substrates and tested according to the above ASTM methods. The results obtained are presented below.

| Tensile Strength | | Lap Shear Strength | |
| --- | --- | --- | --- |
| Time | Strength, psi (kg/cm²) | Time | Strength, psi (kg/cm²) |
| Initial | 90.9 (6.39) | 2 weeks | 90.6 (6.36) |
| 24 hrs | 107.4 (7.55) | 4 weeks | 122.0 (8.58) |
| 4 days | 149.3 (10.5) | 9 weeks | 131.6 (9.25) |
| 6 weeks | 201.4 (14.2) | 10 weeks | 152.0 (10.7) |
| 10 weeks | 253.9 (17.8) | 12 weeks | 161.0 (11.3) |
| 16 weeks | 251.4 (17.7) | 16 weeks | 158.0 (11.1) |

As shown by the test results, in this formulation both the tensile strength and the shear strength increase over a period of weeks after fabrication of the test panels.

Comparative Example Silane-modified APAO vs. Standard APAO:

The following formulations are prepared as described above, by combining in a suitable mixing device in the absence of moisture.

|  | Silane-Modified APAO | | Standard APAO | |
|---|---|---|---|---|
| Material | Batch Wt. | % Wt. | Batch Wt. | % Wt. |
| BUTYL ® 268 | 441.7 | 16.4 | 261.8 | 16.4 |
| ECR 158 | 242.9 | 9.0 | 144.0 | 9.0 |
| FORAL ® 85 | 26.3 | 1.0 | 15.6 | 1.0 |
| CaCO$_3$ | 904.5 | 33.5 | 536.0 | 33.5 |
| B-12 PIB | 147.5 | 5.5 | 87.4 | 5.5 |
| VESTOPLAST ® 206 V | 930.8 | 34.5 | 0 | 0 |
| VESTOPLAST ® 750 | 0 | 0 | 551.6 | 34.5 |
| DBTDL | 0.9 | 0 | 0.5 | 0 |
| A186 Silane | 2.7 | 0.1 | 1.6 | 0.1 |
| Vinyl Silane | 2.7 | 0.1 | 1.6 | 0.1 |
| TOTAL | 2700 | 100.1 | 1600.1 | 100.1 |

VESTOPLAST ® 206 V is a silane-modified APAO. VESTOPLAST ® 750 is a standard, non-silane APAO. Vinyl silane is a silane compound including at least one vinyl group, for example, vinyltrimethoxy silane. A186 Silane is believed to contain β-(3,4-epoxycyclohexyl)-ethyltrimethoxysilane, and is commercially available from OSi Specialties, Inc., Danbury, Connecticut.

Lap Shear Tests:

The foregoing formulations are applied to test substrates, and the lap shear strength is determined according to ASTM C 961-87. The results obtained are shown below.

| Silane-Modified APAO | | | Standard APAO | | |
|---|---|---|---|---|---|
| Time | Strength, psi (kg/cm$^2$) | Failure Mode | Time | Strength, psi (kg/cm$^2$) | Failure Mode |
| 24 hr. | 116 (8.1) | cohesive | 24 hr. | 89 (6.3) | adhesive |
| 1 week | 122 (8.6) | cohesive | 1 week | 88 (6.2) | adhesive |
| 2 weeks | 148 (10.4) | cohesive | 2 weeks | 95 (6.7) | adhesive |
| 4 weeks | 142 (10.0) | cohesive | | | |

In the foregoing test results, in the "cohesive" failure mode, the adhesive composition separates internally with adhesion to both substrates maintained, while in the "adhesive" failure mode, adhesion of the adhesive composition to one substrate fails, and all of the adhesive remains on one substrate or the other. Thus, the foregoing test demonstrates that the silane-modified polymer or copolymer provides enhanced strength in adhesion to the test substrate, compared to the same formulation prepared without the silane-modified polymer or copolymer.

Although the invention has been shown and described with respect to certain preferred embodiments, equivalent alterations and modifications will occur to others skilled in the art upon reading and understanding this specification and the annexed drawings. In particular regard to the various functions performed by the above described integers (components, assemblies, devices, compositions, steps, etc.), the terms (including a reference to a "means") used to describe such integers are intended to correspond, unless otherwise indicated, to any integer which performs the specified function of the described integer (i.e., that is functionally equivalent), even though not structurally equivalent to the disclosed structure which performs the function in the herein illustrated exemplary embodiment or embodiments of the invention. In addition, while a particular feature of the invention may have been described above with respect to only one of several illustrated embodiments, such feature may be combined with one or more other features of the other embodiments, as maybe desired and advantageous for any given or particular application.

What is claimed is:

1. A solar panel comprising:
   a front panel;
   a photovoltaic material layer deposited either directly on the front panel or directly on an anti-reflective coating formed between the front panel and the photovoltaic material layer;
   a backing panel;
   an adhesive layer adhering the photovoltaic material layer to the backing panel;
   wherein the adhesive layer comprises an adhesive composition, the adhesive composition comprising a low MVTR polymer or copolymer and a silane-modified polymer or copolymer, wherein the silane-modified polymer or copolymer is provided to the adhesive preformed and is different from the low MVTR polymer or copolymer; and
   wherein the silane-modified polymer or copolymer is a silane-crosslinkable halogenated polymer composition comprising a mixture of 100 parts by weight of a halogenated polymer and about 0.1 to about 20 parts by weight of an amino group-containing silane compound having the following general structure:

RHNR'Si(OR")$_3$ wherein R is hydrogen, an alkyl or a phenyl group, R' is an alkylene group, OR" is an alkoxy or alkoxyalkoxy group having 1 to 6 carbon atoms.

2. A method of fabricating a solar panel comprising a front panel, a photovoltaic material layer deposited either directly on the front panel or directly on an anti-reflective coating formed between the front panel and the photovoltaic material layer and a backing panel, the method comprising:
   (a) forming an adhesive composition having a low moisture vapor transmission rate by combining a low MVTR polymer or copolymer with a silane-modified polymer or copolymer, wherein the silane-modified polymer or copolymer is provided to the adhesive preformed and is different from the low MVTR polymer or copolymer;
   (b) adhering the photovoltaic material layer to the backing panel using the adhesive composition; and
   (c) cross-linking the silane-modified polymer or copolymer;
   wherein the low MVTR polymer or copolymer comprises at least one of a polyisobutylene, an isobutylene-isoprene copolymer, an isobutylene-isoprene-divinylbenzene copolymer, a chlorinated or brominated butyl rubber, an isobutylene-brominated p-methylstyrene copolymer, an isobutylene-p-methylstyrene copolymer, a chlorosulfonated polyethylene, an ethylene-alkyl (meth)acrylate copolymer, an acrylonitrile-butadiene copolymer, polychloroprene and mixtures of two or more thereof.

* * * * *